United States Patent [19]

Tabatabaie

[11] Patent Number: 4,941,025
[45] Date of Patent: Jul. 10, 1990

[54] QUANTUM WELL SEMICONDUCTOR STRUCTURES FOR INFRARED AND SUBMILLIMETER LIGHT SOURCES

[75] Inventor: Nader Tabatabaie, Red Bank, N.J.

[73] Assignee: Bell Communications Research, inc., Livingston, N.J.

[21] Appl. No.: 276,954

[22] Filed: Nov. 28, 1988

Related U.S. Application Data

[63] Continuation-in-part of Ser. No. 139,380, Dec. 30, 1987.

[51] Int. Cl.$^5$ ............... G06F 11/10; H03M 13/12; H01L 29/161; H01L 33/00
[52] U.S. Cl. ............................ 357/16; 357/17; 357/4; 357/30; 372/44; 372/45; 372/50
[58] Field of Search ............... 357/4, 16, 17, 30; 372/44, 45, 50

[56] References Cited

U.S. PATENT DOCUMENTS

| | | | |
|---|---|---|---|
| 3,611,180 | 10/1971 | Lasser | 331/94.5 |
| 4,163,237 | 7/1979 | Dingle et al. | 357/16 |
| 4,163,238 | 7/1979 | Esaki et al. | 357/17 |
| 4,250,515 | 2/1981 | Esaki et al. | 357/16 |
| 4,571,727 | 2/1986 | Nishizawa et al. | 372/4 |
| 4,589,115 | 5/1986 | Burnham et al. | 372/45 |
| 4,644,553 | 2/1987 | Van Ruyven et al. | 372/45 |
| 4,647,953 | 3/1987 | Okajima et al. | 357/17 |
| 4,680,768 | 7/1987 | Yagi | 372/45 |
| 4,745,612 | 5/1988 | Hayakawa et al. | 357/16 |
| 4,760,430 | 7/1988 | Coon et al. | 357/16 |
| 4,804,639 | 2/1989 | Yablonovitch | 357/17 |

OTHER PUBLICATIONS

Ackley et al., "GaAs Light-Emitting Diodes with nipi Active Layers Fabricated by Selective Contact Diffusion", Appl. Phys. Lett. 53 vol. 2, Jul. 11, 1988, pp. 125-127.

Primary Examiner—Eugene R. LaRoche
Assistant Examiner—Michael B. Shingleton
Attorney, Agent, or Firm—James W. Falk

[57] ABSTRACT

A quantum well structure comprises a layered semiconductor definitive of a quantum well profile that contains at least two subbands characterized by an enhanced carrier conductivity difference between the subbands. The doping of the layered structure establishes a carrier population only within the lower-energy subband. A dynamic carrier population inversion between subbands is established by applying an external electric field in the plane of the quantum well. Light output from the structure results from intersubband transitions. In one device embodiment, the carriers comprise electrons, the subband profile is within the conduction band, and the quantum well profile comprises a nested quantum well profile. In another device embodiment, the carriers comprise holes, the subband profile is within the valence band, and the quantum well profile comprises a strained quantum well profile. One important application for such devices is as a far-infrared or submillimeter light source.

6 Claims, 6 Drawing Sheets

QUANTUM WELL SEMICONDUCTOR STRUCTURES FOR INFRARED AND SUBMILLIMETER LIGHT SOURCES

CROSS-REFERENCE TO RELATED APPLICATION

This is a continuation-in-part of application Ser. No. 139,380, filed December 30, 1987, now abandoned.

BACKGROUND OF THE INVENTION

1. Field of the Invention

The invention relates to semiconductor infrared and submillimeter light sources and devices, and in particular to multiple quantum well semiconductor structures capable of submillimeter wave radiation.

2. Description of the Prior Art

Various types of semiconductor structures which act as light emitters are known in the prior art. For example, in a gallium arsenide homojunction light emitter, electrons are injected across a pn junction, combine with holes, and give up excess energy by emitting light at a wavelength characteristic of the material. In a so-called double heterojunction (or double heterostructure) light emitter, fabricated, for example, using a gallium arsenide/aluminum gallium arsenide material system, a pair of relatively wide bandgap layers (aluminum gallium arsenide) of opposite conductivity type are sandwiched around an active region (gallium arsenide). The interfaces between the active region and the wide bandgap layers form a pair of heterojunctions. These heterojunctions effectively provide carrier confinement and optical confinement. The devices are generally used as light emitting diodes or lasers, and may be energized using an electrical current or optical pumping.

A conventional double heterojunction semiconductor laser generally is based upon a three-layered structure in which an active layer formed of a III-V compound semiconductor such as gallium arsenide (GaAs) is sandwiched between two GaAlAs layers. This three-layered structure is further sandwiched between positive and negative electrodes. In a resonator of a semiconductor laser having such a structure, two reflecting planes or mirrors are obtained by cleaving a double heterojunction wafer. They are perpendicular to a junction plane. Since these cleaved surfaces are significantly smooth, they can be used as the reflecting planes of the resonator.

In such a structure, when a forward-bias DC voltage is applied between the positive and negative electrodes, minority carriers are injected into a GaAs active layer where light emission takes place. Since a refractive index of the GaAs active layer is higher than that of the GaAlAs layers formed on the upper and lower surfaces thereof, emitted light is confined to the active layer and is repeatedly reflected between two opposite reflecting planes, thereby causing laser emission. Part of the laser light is externally emitted through the reflecting planes.

The wavelength of radiation generated by conventional double heterojunction devices is a function of the bandgap of the active region. Within limits, the wavelength of the radiation produced can be changed to some extent by altering the composition of the active region. Since light emission from a semiconductor laser is the result of recombination of excited electrons in the conduction band with holes in the valence band, the bandgap energy can be varied by an appropriate choice of semiconductor compounds. For example, the gallium aluminum arsenide alloy $Ga_xAl_{1-x}As$ (where x is a positive number less than 1) can be made to have any bandgap between 1.4 and 2.2 eV by varying the ratio between the amount of Ga and Al in the formulation. Pure GaAs represents a bandgap of 1.4 eV, while pure AlAs represents a bandgap of 2.2 eV. The conventional semiconductor lasers of the prior art are limited to light production in the wavelength range of 1.7 $\mu$m to 0.5 $\mu$m.

Semiconductor lasers based upon quantum well and multiple quantum well structures are also known in the prior art. A multiple quantum well structure comprises a first plurality of relatively narrow bandgap semiconductor layers and a second plurality of relatively wide bandgap semiconductor layers. The relatively narrow bandgap layers are interleaved with and contiguous with the relatively wide bandgap layers. The wide-bandgap layers should exhibit a conduction and/or valence band step sufficiently large to confine electrons and/or holes respectively to the narrow bandgap layers. In other words, the steps in the conduction and valence bands serve to define quantum wells whose widths are coextensive with the narrow bandgap layers. These quantum wells confine the charge carriers to the narrow bandgap layers and tend to inhibit the transverse movement of the charge carriers from one layer to the next.

Preferably, the adjacent wide and narrow bandgap layers are substantially lattice matched so that the heterojunctions formed therebetween are substantially defect-free. The multiple quantum well structure may be formed by alternatingly depositing AlGaAs and GaAs layers on a semi-insulating GaAs substrate. The multiple quantum well structure may also be formed from other III-V compounds such as the InP-In GaAsP or InAs-GaAsSb materials systems.

Multiple quantum well structures have found numerous uses in electronics and optical-electronics. Such devices may be used as infrared radiation sources (see for example, Esaki et al. U.S. Pat. No. 4,163,238); negative resistance devices (see, for example, Esaki et al U.S. Pat. No. 4,250,515) and FET devices (see, for example, Dingle et al. U.S. Pat. No. 4,163,237). Multiple quantum well devices may also be used as memory devices in which charge is stored and released from the quantum wells. As more fully described in such references, a quantum well, as we use it herein, is a region having a conductor or valence band step of sufficient magnitude to confine carriers to that region.

Specific designs for semiconductor lasers using multiple quantum well structures are described in Van Ruyven et al., U.S. Pat. No. 4,644,553; Okajima et al, U.S. Pat. No. 4,647,953; and Yagi, U.S. Pat. No. 4,680,768.

Semiconductor lasers of the prior art have not been suitable for generating radiation in the submillimeter to far-infrared region (wavelength from 10 $\mu$m to 1 mm). Although various types of far-infrared generators have been proposed in the prior art (e.g., U.S. Pat. Nos. 3,611,180 and 4,571,727) such devices require very low temperature operation or other complex requirements for successful operation. Prior to the present invention, there has not been a simple semiconductor structure for generating radiation in the submillimeter to far-infrared region at room temperature.

SUMMARY OF THE INVENTION

Briefly, and in general terms, the invention provides a semiconductor structure for generating infrared and submillimeter wave radiation utilizing radiative transitions in a quantum well semiconductor structure.

More particularly, the present invention provides, for example, a nested quantum well device formed on a substrate defined by a semiconductor layered region disposed on the substrate having at least one relatively narrow bandgap layer, two relatively intermediate width bandgap layers and two relatively wide bandgap layers. The relatively narrow bandgap layer is sandwiched between and contiguous with the relatively intermediate width bandgap layers and defines a first quantum well. The intermediate width bandgap layers are sandwiched between and contiguous with the relatively wide bandgap layers and defines a second quantum well. A potential bias is applied parallel to the layered region so that electrons in the first well are excited to an energy level of the second quantum well. One important application for such a device is as a far-infrared or submillimeter light source. The excitation of electrons creates a population inversion, and electrons fall through the relatively small energy difference between the levels resulting in the emission of far-infrared radiation.

In accordance with the principles of the present invention, a quantum well structure comprises a layered semiconductor definitive of a quantum well profile that contains at least two subbands characterized by an enhanced carrier conductivity difference between the subbands. The doping of the layered structure establishes a carrier population only within the lower-energy subband. A dynamic carrier population inversion between subbands is then established by applying an external electric field in the plane of the quantum well. Light output from the structure results from inter-subband transitions. In one particular embodiment, the carriers comprise electrons, the subband profile is within the conduction band, and the quantum well profile comprises a nested quantum well profile. In another embodiment, the carriers comprise holes, the subband profile is within the valence band, and the quantum well profile comprises a strained quantum well profile.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DETAILED DESCRIPTION

Figure 1:
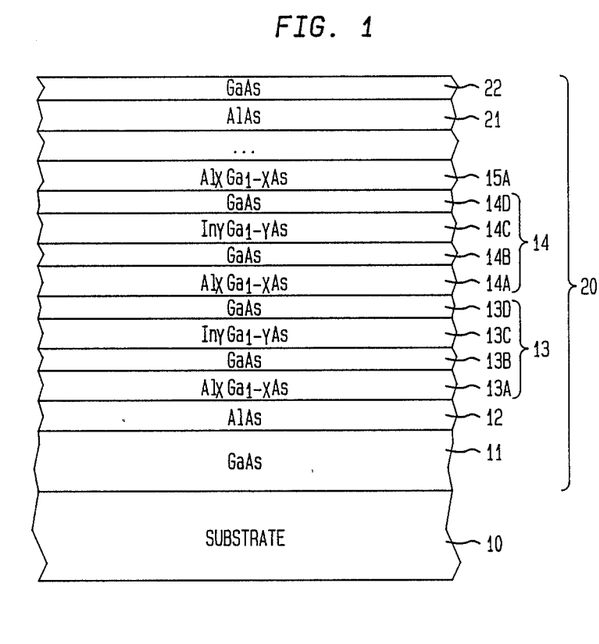
FIG. 1 is a detailed cross-sectional view of a portion of the semiconductor structure according to the present invention.

Referring to FIG. 1, there is shown a semiconductor structure in accordance with the invention for generating radiation in the infrared region.

The starting point of fabricating the semiconductor structure according to one specific illustrative embodiment of the present invention is to provide a semi-insulating crystal substrate 10, preferably composed of gallium arsenide (GaAs) oriented in the <100> direction.

The following description focuses on the growth and deposition of the multiple layer structure 20 on the substrate 10 which forms the semiconductor structure according to the present invention. The layers are grown sequentially on the substrate 10 according to molecular beam epitaxy techniques known in the art, although any other suitable deposition technique could be used as well.

The basic structure of the multiple layer structure 20 is to provide an active layer bounded by upper and lower clad layers. For laser or light emitting operation, it is necessary that electromagnetic radiation produced in the active region remain in the active region. Thus, the active layer is situated between two clad layers having a lower refractive index than the active region.

A first layer 11 of undoped gallium arsenide is deposited on the substrate 10 to serve as a buffer layer. The thickness of the first layer 11 is preferably about 1 micron.

A second layer 12 of undoped AlAs semiconductor material having a thickness of approximately 1000 angstroms is then deposited on the first layer 11 to form a first cladding layer. The cladding layer 11 is selected so as to have a larger bandgap energy and smaller optical refraction index than the active layer.

At least one nested quantum well structure 13 is then deposited on the second layer 12 to form the active region of the device. FIG. 1 depicts a plurality of such quantum well structures 13, 14, etc. deposited sequentially on the second layer 12 and such multiple quantum well configuration is intended to be within the scope of the present invention.

The nested quantum well structure 13 preferably consists of a semiconductor layered region having at least one relatively narrow bandgap layer 13c, two relatively intermediate width bandgap layers 13b and 13d forming a first quantum well, and two relatively wide bandgap layers 13a and 14a. The relatively narrow bandgap layer 13c is sandwiched between and contiguous with the relatively intermediate width bandgap layers 13b and 13d and defines a second quantum well. The intermediate width bandgap layers 13b and 13d are sandwiched between and contiguous with the relatively wide bandgap layer 13a and 14a.

Figure 3:
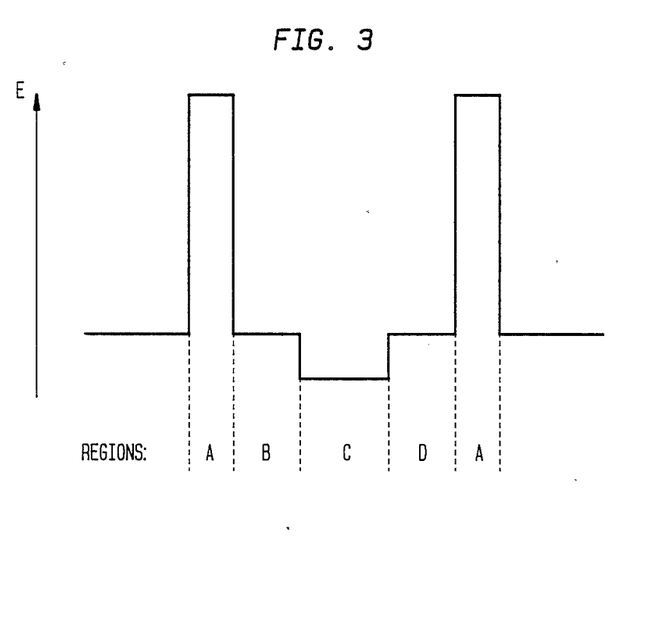
FIG. 3 is a graph of the energy band diagram of the repeating quantum well portion of the semiconductor structure shown in FIG. 1.

FIG. 3 shows diagrammatically a representation of the energy band levels in a single nested quantum well structure of FIG. 1. Region A in FIG. 3 corresponds to layer 13a in FIG. 1; region B in FIG. 3 corresponds to layer 13b in FIG. 1; region C in FIG. 3 corresponds to layer 13c in FIG. 1; region D in FIG. 3 corresponds to layer 13d in FIG. 1; region A (on the far right hand side of FIG. 3) corresponds to layer 14a in FIG. 1; and so on.

In the preferred embodiment, layer 13a may be composed of $Al_xGa_{1-x}As$ (where x is a positive number less than 1), with a doping level of n equal to $1 \times 10^{17} cm^{-3}$, using a silicon doping source. The specific preferred material for the layer 13a is $Al_{0.3}Ga_{0.7}As$, with a thickness of about 100 angstroms.

Layer 13b is preferably composed of undoped GaAs with a thickness of about 40 angstroms.

Layer 13c is preferably composed of undoped $In_yGa_{1-y}As$ (where y is a positive integer less than 1). The specific preferred material is $In_{0.1}Ga_{0.9}As$ having a thickness of about 50 Angstroms.

Layer 13d is composed of the same material and has the same thickness as layer 13b. Layer 14a is composed of the same material and has the same thickness as layer 13a.

The second nested quantum well structure 14 (composed of layers 14a, 14b, 14c, and 14d) has the identical materials and thicknesses as the first nested quantum well structure 13, as do subsequent nested quantum well structures formed above layer 15a.

Figure 2:
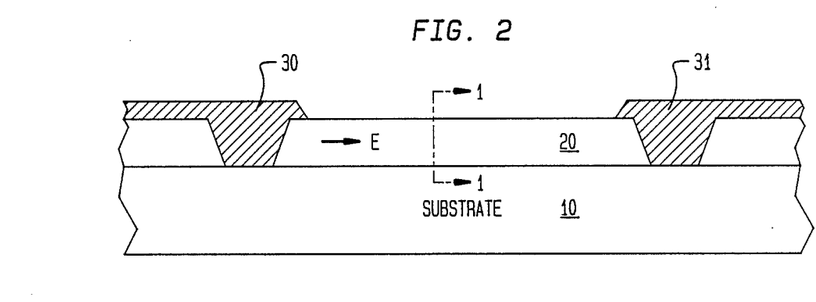
FIG. 2 is a highly simplified diagrammatic cross-sectional view of the semiconductor structure according to the present invention.

Turning to FIG. 2, there is shown a highly simplified diagrammatic cross-sectional view of the semiconductor structure of the present invention. The multiple layer structure 20 has been described in detail in FIG. 1. As shown in FIG. 2, the layer structure 20 is preferably a mesa-type structure deposited on the substrate 10 much like the fabrication of semiconductor lasers. Metallic contacts 30 and 31 are deposited along the two edges of the layer structure 20 extending to the substrate 10. A suitable potential is applied to contacts 30 and 31 so that an electric field E is created in the structure 20, parallel to the layers in structure 20.

Radiative emission occurs according to the present invention when the device is biased to an excited state by the electrical potential applied to the contacts 30 and 31. Charge carriers (electrons) are first excited to a high energy level and then fall through a relatively small energy difference compared to visible light semiconductor lasers. The electrons are made to fall through the energy separation by creating a population inversion of carriers from a lower level to an excited high level.

More particularly, it is the electrons in the quantum well formed by 13b and 13d (as well as 14b, 14d, etc.) which fall into an energy state in the lower quantum well 13c which result in emission of radiation. The electric field E excites the electron in the lower quantum well 13c back up to a higher energy level in the quantum well formed by 13b and 13d. The nested quantum well structure according to the present invention has configured the suitable allowable energy levels which permit the electrons to change energy between such relatively small energy difference which makes possible radiative emission in the infrared range. Spontaneously appearing photons of suitable wavelength will trigger the energy level drops, which results in the emission of coherent infrared radiation. When the device according to the present invention is biased to the excited state resonance, a large electron population builds up within the quantum well at that energy level. This condition is known as population inversion since now there are many available states at the lower ground state energy for the electrons to fall into. A strong radiative transition between these two levels permits a new class of far infrared solid state injection sources.

In all semiconductor quantum well lasers operational today, light emission results from electron transitions from the conduction energy band to the valence energy band (interband transitions). This is the same mechanism which is used in bulk semiconductor lasers as well. The effect of quantum confinement is primarily to modify the density of allowed states in the aforementioned energy bands in such a way as to increase the quantum efficiency of the stimulated emission process. The wavelength of the emitted radiation is determined by the sum of the bandgap and carrier confinement energies. This places a limit on the range of photon wavelengths which can be stimulated using common semiconductor quantum well structures. For example, quantum wells fabricated in the popular AlGaAs alloy system can emit in the 600 to 900 nm range, covering from green to near-infrared wavelengths. There are many applications, however, that require stable room temperature light sources at considerably longer wavelengths. The long-wavelength limit can be extended by using smaller-bandgap semiconductors. Lasers fabricated in the InGaAsP alloy system, lattice matched to InP, can reach 1700 nm. Still other systems have been suggested for even longer wavelengths but in practice they often prove technologically difficult to fabricate.

Alternatively, longer wavelength radiation can be produced if the electron energy transition remains within a single band (intraband transitions). Two examples of the above are: spin-flip lasers and $E \times B$ lasers. In both cases, however, very low temperatures and large magnetic fields are required for laser operation.

The present invention is based on the recognition that quantum well structures provide yet another possibility for fabricating intraband-transition lasers. Quantum confinement results in the break-up of the conduction (or valence) energy band into a set of subbands. The subbands are usually identified by an integer index starting with 1 for the lowest energy subband. Optical transitions are allowed betwen subbands where the difference between the index numbers is odd (subband 2 to subband 1, for example).

Sustained stimulated emission (lasing) requires two important conditions to be met. First, there must exist sufficient population inversion between the subbands to provide a net gain for light amplification. Second, proper waveguiding must be provided in order to select the appropriate optical modes and maintain reasonable injection thresholds for lasing. While long-wavelength waveguides are not difficult to design and fabricate in quantum well structures, steady state population inversion between subbands has not heretofore been achieved. There is a fundamental problem which precludes population inversion in all of the hitherto proposed inter-subband laser structures. Electrons (or holes) excited into high energy subbands are far more probable to lose their excess energy nonradiatively as they fall to lower energy subbands and reach thermal equilibrium. For AlGaAs quantum wells, the nonradiative transfer process is favored over spontaneous emission of radiation by a thousand to one. The nonradiative transition to stimulated emission ratio is only slightly better at a hundred to one. Conventional static population inversion between subbands is therefore prohibitively difficult, if not impossible to achieve.

In accordance with the present invention, a method for achieving population inversion between subbands is specified. Two specific illustrative structures will be described, one each for carriers in the conduction and valence energy bands. In these structures, it is possible under proper excitation to achieve a condition of dynamic population inversion between the quantum well subbands. The description below specifies how such a quantum well design is incorporated in a waveguide structure in order to fabricate a long-wavelength laser diode.

It is possible to fabricate quantum well structures having two adjacent (in energy) subbands with substantially different transport characteristics in the plane of the well. The exact layer thicknesses and material compositions required for maximizing the above will be discussed later. For now, assume that the more energetic of the two subbands confined in a quantum well has both a higher in-plane effective mass and also a higher scattering rate. Furthermore, it is required that the Fermi level in this structure fall between the two dissimilar subbands. Initially, emphasis will be concentrated on structures based on electron confinement (conduction band operation). Later, the description will be expanded to cover hole-confinement structures as well.

Under the influence of an external electric field, F, applied in the plane of the quantum well, electrons, initially all in the lower subband, will begin to heat, and some are transferred to the higher subband. The rate at which energy is inputted to the structure is given by, $$\sum_{i=1}^{2} e n_i \mu_i F^2 \quad (1)$$

where e is the electronic charge and $n_i$ and $\mu_i$ are, respectively, electron concentration and electron mobility in subband index i. The power absorbed per electron is then, $$\frac{e^2 \tau_i}{m_i^*} F^2 \quad (2)$$

where $m^*$ is the in-plane effective mass and $\tau$ is the elastic mean free time which is the inverse of the scattering rate. Since $\tau_1 > \tau_2$ and $m_1^* < m_2^*$, the electrons in the lower subband gain energy from the electric field at a much faster rate than those in the upper subband. This is one of the key reasons why a population inversion can be achieved in quantum well structures made in accordance with the principles of the present invention. The electron population in the individual subbands can be calculated analytically using the Boltzmann equation.

Figure 4A:
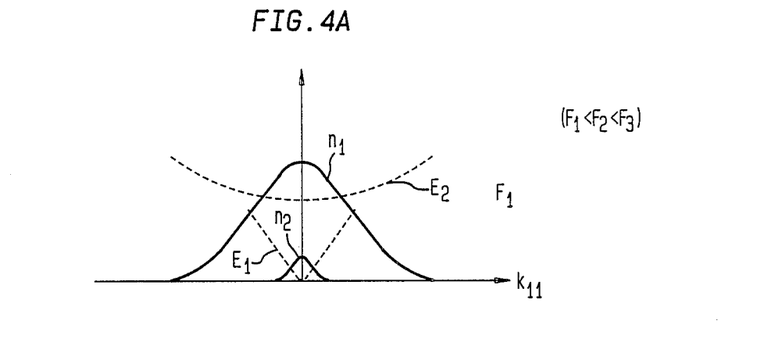
FIG. 4a, 4b and 4c shows the electron distribution function dependence on parallel momentum for several values of electric field applied to a quantum-well structure.
Figure 4B:
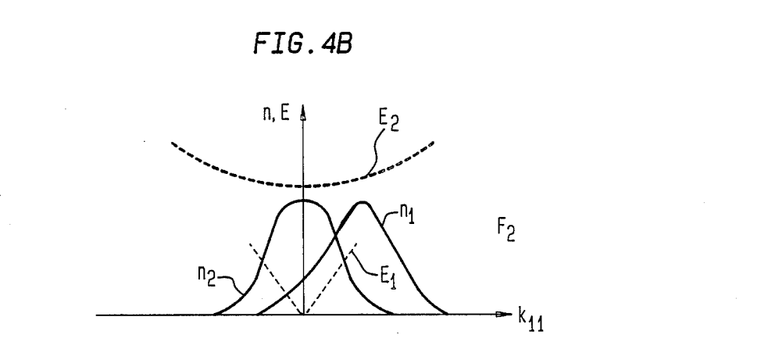
Figure 4C:
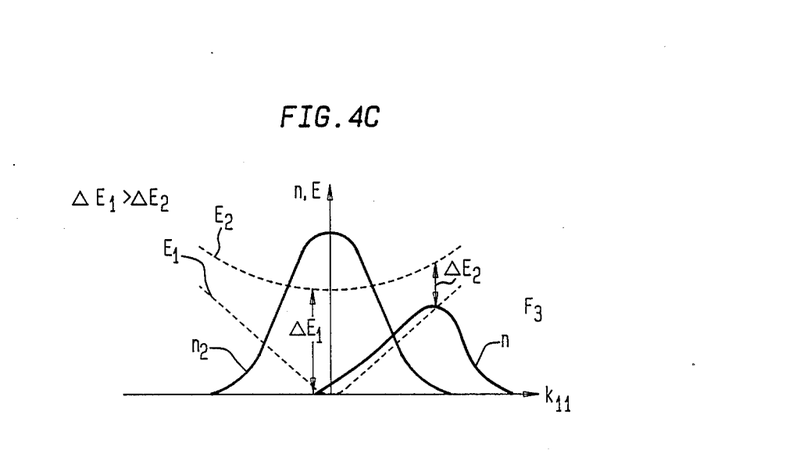

FIG. 4 shows the electron distribution function dependence on parallel momentum for several values of the external field. In particular, FIG. 4 shows that carrier population in the higher-energy subband, $n_2$, can become larger than that in the lower subband. Furthermore, the difference in the effective masses of the two subbands in the described structures separates (in energy) the regions of optical gain ($n_2 > n_1$) and loss ($n_2 < n_1$). This can be seen readily from the dispersion relations (energy versus momentum) superimposed on the electron population graphs of FIG. 4. This larger energy difference is illustrated in FIG. 4(c) by transitions $\Delta E_1$, and $\Delta E_2$, measured at the peak gain and peak loss ranges in the dispersion.

It is also possible for the hot electrons in the $\Gamma$ valley of the lower energy (i=1) subband to transfer to a satellite valley associated with this subband prior to reaching the i=2 subband. This spurious transfer can be avoided, however, by using the proper semiconductor alloy system and quantum well subband separations. Thus, in some applications of practical importance, it may be advantageous to use a smaller-bandgap alloy system (e.g. InGaAsP) rather than the particular AlGaAs examples described herein.

Figure 5:
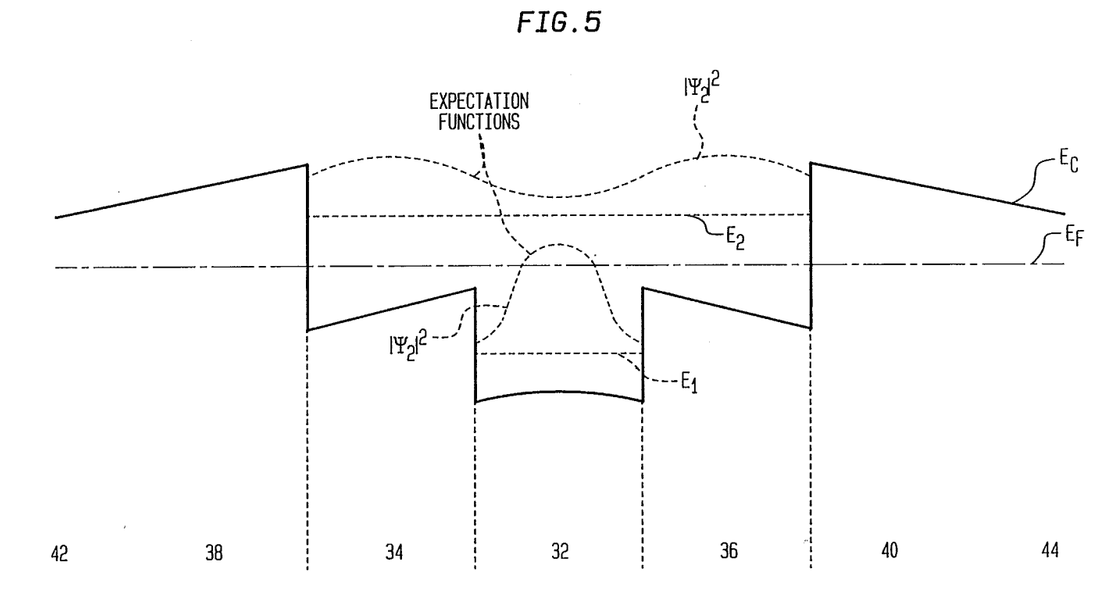
FIG. 5 depicts the quantum well profile for a particular illustrative nested quantum well structure made in accordance with this invention in which electron transitions occur between subbands in the conduction band.

Specific illustrative crystal composition profiles needed for quantum well structures made in accordance with this invention will now be described. As FIG. 5 shows, a nested quantum well structure (conduction-band operation) made in accordance with this invention contains four essential layers. As undoped low-band gap layer 32 which comprises the nested well is sandwiched between two undoped intermediate-bandgap layers 34,36 which when combined with the first layer 32 comprises the encompassing quantum well. The entire structure is surrounded on both sides by, first, undoped and then n-doped large-bandgap layers (38,40 and 42,44 respectively). The thicknesses of the various layers are adjusted such that the first and second ($E_1$ and $E_2$) subbands lie in the nested and encompassing quantum wells, respectively. The thicknesses of the large-bandgap layers are adjusted such that all electrons from the doped layers 42,44 are transferred to the quantum wells, raising the Fermi level ($E_F$) to a level roughly midrange between $E_1$ and $E_2$. The effective mass for electrons in $E_1$ is then simply the low mass of the material of the low-bandgap layer 32 while the effective mass for electrons reaching the $E_2$ subband depends on the effective mass of the various materials over which the electron wave function is spread. A weighted average can be obtained using the electron expectation function $\psi_2$ along the growth axis, z, as follows:

$$m_2^* = \int dz \psi_2^*(z) m^*(z) \psi_2(z) \quad (3)$$

This composite mass $m_2^*$ is substantially heavier than $m_1^*$. Similarly, $\tau_1$ will be much larger than $\tau_2$ since most scattering events influence the electrons in the upper subband more strongly.

Specific illustrative materials and thicknesses for a layered nested quantum well (NQW) semiconductor made in accordance with the principles of the present invention, and having a nested quantum well profile of the type represented in FIG. 5, will now be given. As indicated earlier above, such a layered semiconductor involves charge carrier (electron) transitions between subbands within the conduction band. In such a specific illustrative layered structure, the undoped layer 32 comprises, for example, GaAs having a thickness of about 40 Angstrom units (Å). Each of the undoped layers 34,36 comprises $Al_{0.2}Ga_{0.8}As$ having a thickness of approximately 50 Å. The undoped layers 38,40 each comprise $Al_{0.4}Ga_{0.6}As$ having a thickness of about 70 Å. And the n-doped layers 42,44 each comprise $Al_{0.4}Ga_{0.6}As$ having a thickness of approximately 100 Å and doped to a concentration of about $2 \times 10^{18}$ cm$^{-3}$.

For structures having p-type quantum wells (valence-band operation), a natural interaction between the heavy-hole and light-hole bands results in a situation very similar to that created artificially in the n-type NQW structure described above. This is shown schematically in FIG. 6. The interaction between the two bands (the heavy-hole subband, $E_{hh}$, and the light-hole subband, $E_{lh}$) can be fine tuned using strained-layer quantum wells in order to maximize the carrier energy gain difference between these subbands. (Strain is achieved by purposely deviating from lattice-matched conditions). A population distribution similar to electrons in NQW's is achieved for holes in this type of strained-layer quantum well (QW) structure.

Figure 7:
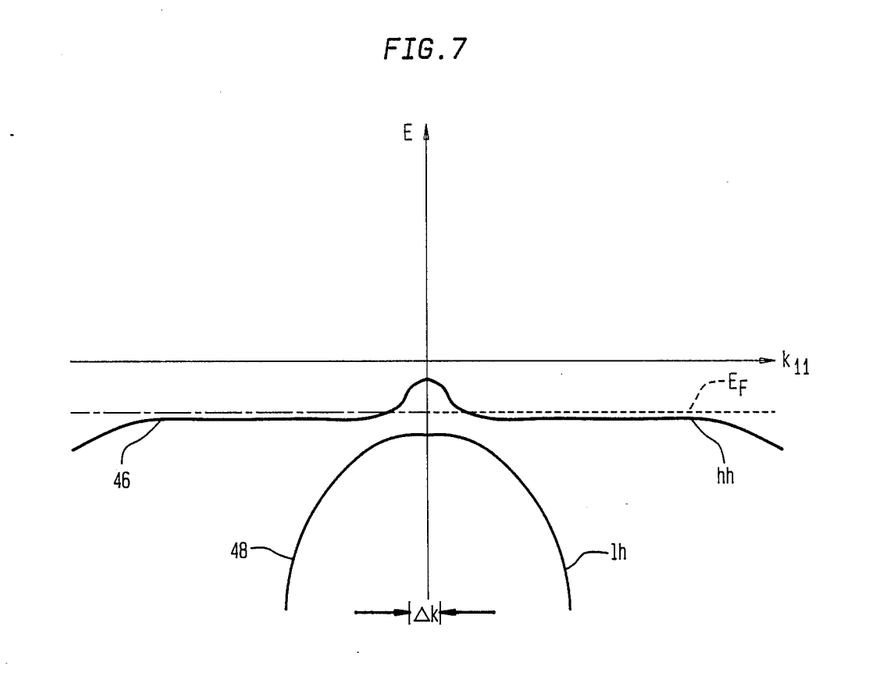
FIG. 7 shows a valence energy band dispersion relation for a particular illustrative strained quantum well structure that embodies the principles of this invention.

FIG. 7 graphically depicts the valence energy band dispersion relation for a particular illustrative QW structure made in accordance with the principles of the present invention. In FIG. 7, curve 46 represents energy versus momentum for the lower or heavy-hole subband within the valence band, while curve 48 represents energy versus momentum for the upper or light-hole subband within the valence band. The region designated Δk in FIG. 7 indicates the range over which the lower subband mass is substantially smaller than the upper subband mass and over which, consequently, laser operation occurs.

Figure 6:
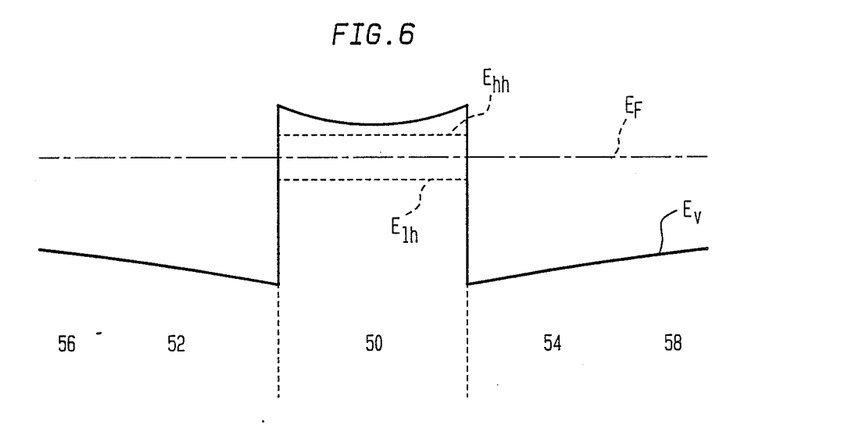
FIG. 6 represents the quantum well profile for a particular illustrative strained quantum well structure made in accordance with this invention in which transitions occur between subbands in the valence band.

Specific illustrative materials and thicknesses for a layered QW semiconductor made in accordance with the principles of the present invention, and having a quantum well profile of the type represented in FIG. 6, will now be given. As indicated earlier above, such a layered semiconductor involves charge carrier (hole) transitions between subbands within the valence band. In such a specific illustrative layered structure, undoped strained layer 50 comprises, for example, $In_{0.2}Ga_{0.8}As$ having a thickness of about 25 Å. (The strain in the layer 50, when fabricated on a GaAs substrate, is fixed by the ratio of In to Ga, in a manner well known in the art). Undoped layers 52,54 each comprise $Al_{0.4}Ga_{0.6}As$ having a thickness of approximately 20 Å. And the p-doped layers 56,58 each comprise $Al_{0.4}Ga_{0.6}As$ having a thickness of about 100 Å and doped to a concentration of about $2 \times 10^{18}$ cm$^{-3}$.

Figure 8:
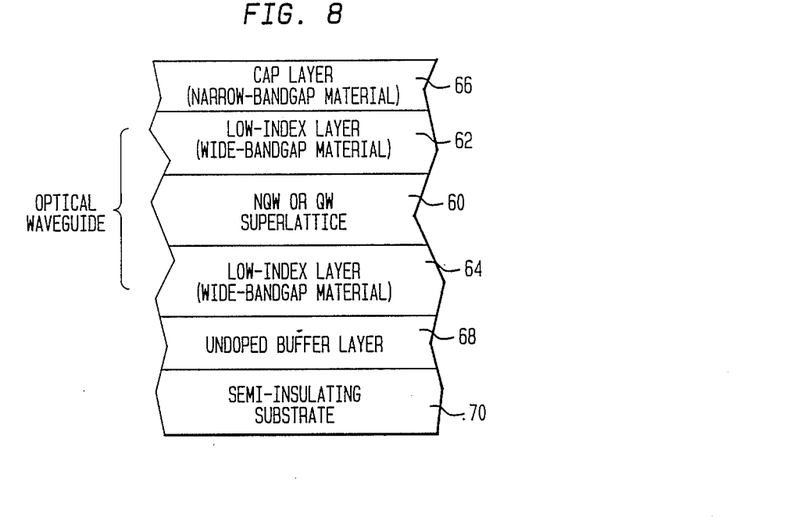
FIG. 8 is a cross-sectional representation of a nested-quantum-well or quantum-well structure made in accordance with this invention combined with waveguiding capabilities.

Waveguiding of stimulated emission generated in NQW or QW structures made in accordance with the principles of the present invention is achieved using, for example, conventional step-index guiding. A schematic cross-sectional representation of such a structure having waveguiding capabilities is depicted in FIG. 8. In one such specific illustrative structure, region 60 in FIG. 8 comprises an NQW or QW superlattice (i.e. multiple stacked NQWs or QWs of the type described above). Layers 62,64 each comprise, for example, AlAs. Illustratively, cap layer 66 comprises InGaAs, layer 68 comprises undoped GaAs and the substrate 70 comprises GaAs.

Figure 9:
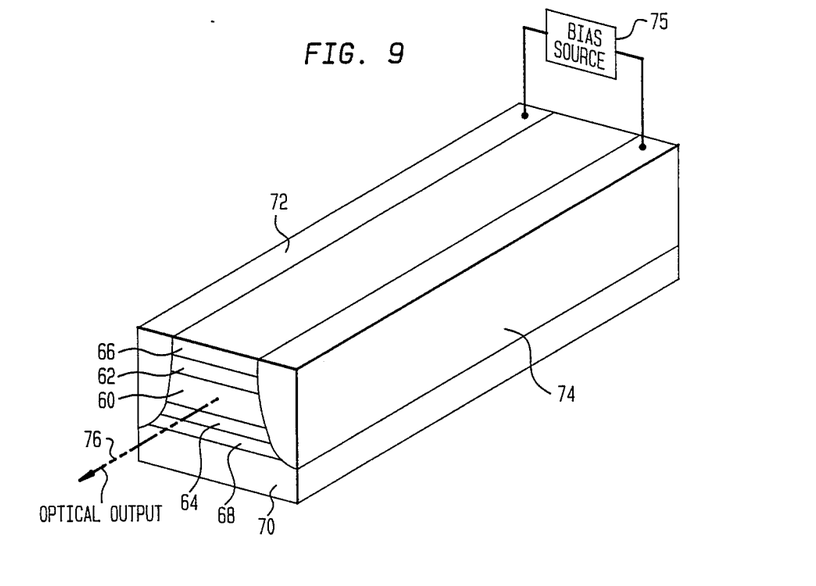
FIG. 9 shows a complete laser device that includes the FIG. 8 structure.

A complete laser device that illustratively embodies the principles of the present invention is shown in FIG. 9. The layers depicted in FIG. 8 are also indicated in FIG. 9 with the same respective reference numerals. In FIG. 9, the front and back faces of the device comprise cleaved facets. Ohmic contacts 72,74 are made, for example, of Ni/AuGe/Au which is a conventional ohmic contact material. Bias source 75 is connected between the contacts 72,74. The value of the voltage applied to the contacts 72,74 by the source 75 to achieve light output from the device in the direction of arrow 76 is dependent on the length of the device, the particular materials included in the layered structure and the doping levels employed therein. For each particular set of such parameters, a suitable voltage value to achieve lasing in such an NQW or QW device is easily established.

While the invention has been illustrated and described as embodied in semiconductor structures for infrared and submillimeter light sources, it is not intended to be limited to the details shown, since various modifications and structural changes may be made without departing in any way from the spirit of the present invention.

Without further analysis, the foregoing will so fully reveal the gist of the present invention that others can readily adapt it for various applications without omitting features that from the standpoint of prior art, fairly constitute essential characteristics of the generic or specific aspects of this invention, and, therefore, such adaptations should and are intended to be comprehended within the meaning and range of equivalence of the following claims.

What is claimed is:

1. A quantum well structure comprising
a layered semiconductor definitive of a quantum well profile containing at least two subbands both within either the conduction band or the valence band, said subbands being characterized by an enhanced carrier conductivity difference between the subbands, the doping of said layered semiconductor establishing carrier population only within the lower-energy subband,
and means for establishing a dynamic population inversion between said subbands in the quantum well profile,
wherein said means for establishing a dynamic population inversion includes means for applying an electric field parallel to the layers of said structure.

2. A structure as in claim 1 further including means for providing waveguiding of light generated by intersubband transitions.

3. A structure as in claim 2 wherein said carriers comprise electrons and the subband profile is within the conduction band, and wherein the quantum well profile comprises a nested quantum well.

4. A structure as in claim 3 wherein said layered semiconductor comprises an undoped relatively narrow-bandgap layer sandwiched between undoped intermediate bandgap layers, undoped wide-bandgap layers sandwiching said intermediate bandgap layers, and n-doped wide-bandgap layers sandwiching said undoped wide bandgap layers.

5. A structure as in claim 2 wherein said carriers comprise holes and the subband profile is within the valence band, and wherein the quantum well profile comprises a strained quantum well profile.

6. A structure as in claim 5 wherein said layered semiconductor comprises an undoped strained relatively narrow-bandgap layer sandwiched between undoped wide-bandgap layers, and p-doped wide-bandgap layers sandwiching said undoped wide-bandgap layers.

* * * * *